United States Patent
Kao et al.

(10) Patent No.: US 8,237,479 B2
(45) Date of Patent: Aug. 7, 2012

(54) DELAY LINE CALIBRATION MECHANISM AND RELATED MULTI-CLOCK SIGNAL GENERATOR

(75) Inventors: Hong-Sing Kao, Hsinchu County (TW); Meng-Ta Yang, Miaoli County (TW); Tse-Hsiang Hsu, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/980,359

(22) Filed: Dec. 29, 2010

(65) Prior Publication Data
US 2011/0089985 A1 Apr. 21, 2011

Related U.S. Application Data

(62) Division of application No. 12/437,563, filed on May 8, 2009.

(60) Provisional application No. 61/051,685, filed on May 9, 2008, provisional application No. 61/051,682, filed on May 9, 2008.

(51) Int. Cl.
*H03L 7/00* (2006.01)
(52) U.S. Cl. ....................................................... 327/161
(58) Field of Classification Search .................. 327/158, 327/161
See application file for complete search history.

(56) References Cited

U.S. PATENT DOCUMENTS

| | | | |
|---|---|---|---|
| 6,373,312 B1 | 4/2002 | Barnes | |
| 6,646,484 B2 * | 11/2003 | Ito | 327/158 |
| 6,731,147 B2 | 5/2004 | Fiscus | |
| 7,218,158 B2 | 5/2007 | Kim | |
| 7,719,332 B2 | 5/2010 | Heragu | |
| 7,813,466 B2 | 10/2010 | Huang | |
| 2006/0193419 A1* | 8/2006 | Maneatis et al. | 375/376 |
| 2008/0191773 A1 | 8/2008 | Oh | |
| 2008/0278203 A1 | 11/2008 | Obkircher | |

FOREIGN PATENT DOCUMENTS

| | | |
|---|---|---|
| CN | 1231548 A | 10/1999 |
| CN | 1996762 A | 7/2007 |
| JP | P200550228 A | 2/2005 |
| TW | 571515 | 1/2004 |
| TW | 200419910 | 10/2004 |
| TW | 200610276 | 3/2006 |

* cited by examiner

*Primary Examiner* — Lincoln Donovan
*Assistant Examiner* — Daniel Rojas
(74) *Attorney, Agent, or Firm* — Winston Hsu; Scott Margo

(57) ABSTRACT

A delay line calibration mechanism includes a first delay line, a second delay line, a phase detector, and a controller. The first delay line receives a first pulse and a first delay selection signal, and delays the first pulse for a first delay period according to the first delay selection signal to output a first delayed pulse. The second delay line receives a second pulse and a second delay selection signal, and delays the second pulse for a second delay period according to the second delay selection signal to output a second delayed pulse. The phase detector generates a phase difference signal indicating the phase difference between the first delayed pulse and the second delayed pulse by comparing the first delayed pulse and the second delayed pulse. The controller generates the second delay selection signal, and generates the first delay selection signal according to the phase difference signal.

20 Claims, 6 Drawing Sheets

DELAY LINE CALIBRATION MECHANISM AND RELATED MULTI-CLOCK SIGNAL GENERATOR

CROSS REFERENCE TO RELATED APPLICATIONS

This application is a division of U.S. patent application Ser. No. 12/437,563 filed 8 May, 2009, which is based on, and claims the benefit of U.S. Provisional Application No. 61/051,685 filed 9 May 2008 and U.S. Provisional Application No. 61/051,682 filed 9 May 2008, the disclosures of which are all incorporated by reference herein in their entirety.

BACKGROUND OF THE INVENTION

1. Field of the Invention

The present invention relates to delay line calibration mechanisms, and more particularly to a delay line calibration mechanism with simplified circuit architecture and related multi-clock signal generator.

2. Description of the Prior Art

Delay lines are often utilized in various electronics applications for generating a precise delay. Delay-locked loops (DLLs) and delay lines with calibration are two primary implementations. To calibrate a delay line, a replica delay line is utilized. A phase detector compares phase of the output of the replica delay line with phase of a reference clock, and a delay control circuit controls the delay amount of the replica delay line based on the phase difference detected by the phase detector. When the output of the replica delay line and the reference clock are phase-matched, the calibration amount is determined. In this mechanism, it is assumed that the calibrated delay line and the replica delay line are ideally identical, however, there is mismatch between them, and a large amount of jitter is generated accordingly. In addition, the replica delay line increases circuit area and power consumption.

Delay lines are formed of logic circuits which may comprise both active and passive elements that provide delay of the clock inputted to the delay line. However, the amount of delay provided by each circuit element may vary under changing environmental conditions, including temperature, supply voltage, process, and age. As delay lines are called upon to provide precise delay, variation of the amount of delay has potential to wreak havoc in electronic systems. Thus, it is desirable that the delay lines be self-calibrating in order to adjust to the environment, and operate normally throughout their lifetime. Further, it is desirable that the delay lines be able to perform self-calibration during operation, without having to take the electronic system offline for calibration of the delay lines.

SUMMARY OF THE INVENTION

According to an embodiment, a delay line calibration mechanism includes a first delay line, a second delay line, a phase detector, and a controller. The first delay line receives a first pulse and a first delay selection signal, and delays the first pulse for a first delay period according to the first delay selection signal to output a first delayed pulse. The second delay line receives a second pulse and a second delay selection signal, and delays the second pulse for a second delay period according to the second delay selection signal to output a second delayed pulse. The phase detector generates a phase difference signal indicating the phase difference between the first delayed pulse and the second delayed pulse by comparing the first delayed pulse and the second delayed pulse. The controller generates the second delay selection signal, and generates the first delay selection signal according to the phase difference signal.

According to an embodiment, a multi-clock signal generator comprises a plurality of delay lines, each receiving a respective pulse and a respective delay selection signal, and each outputting a respective delayed pulse according to the delay selection signal, a phase detector for generating a phase difference signal indicating the difference between at least two of the delayed pulses outputted by the delay lines, and a controller for generating the delay selection signals according to the phase difference signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
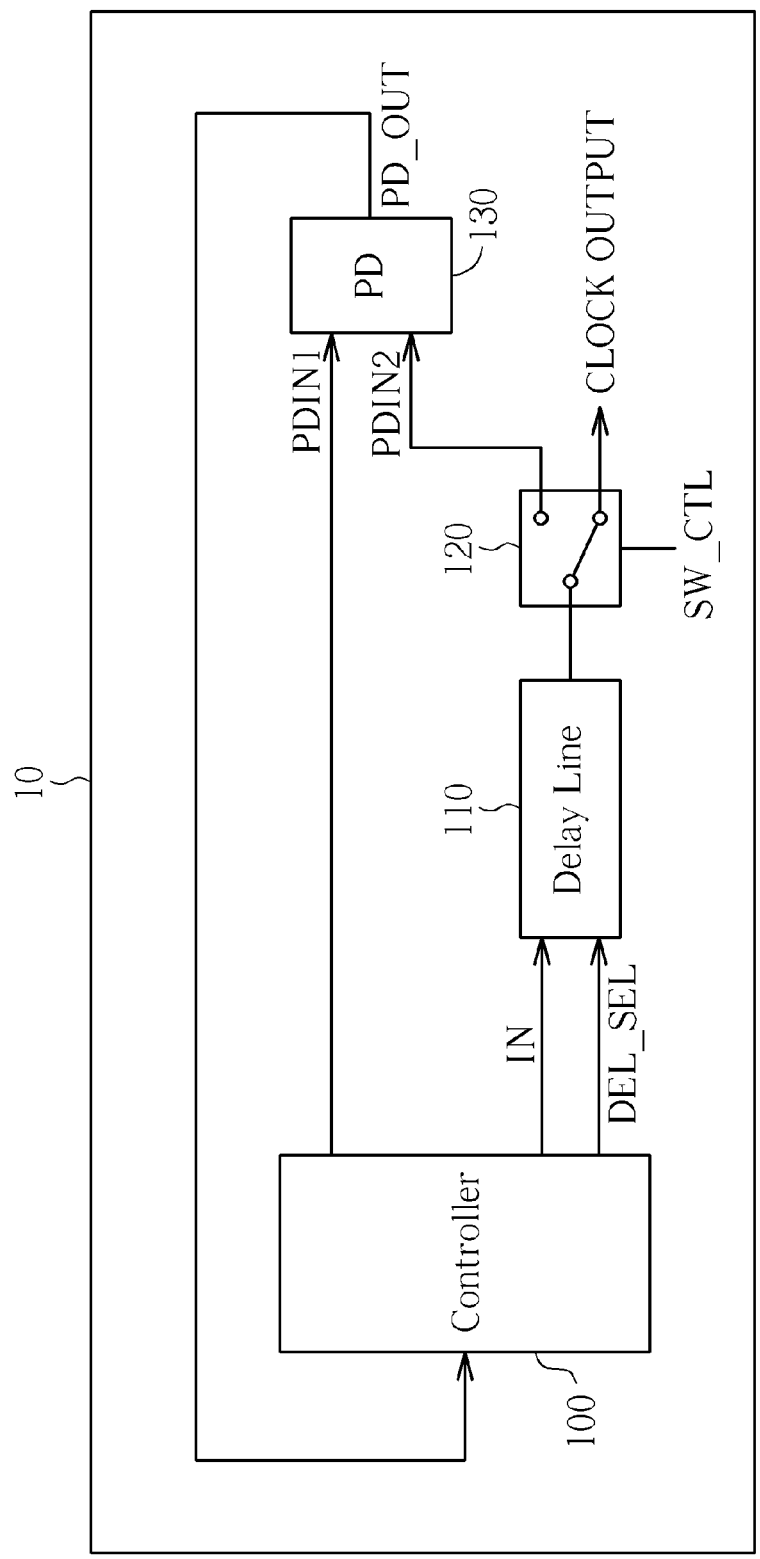
FIG. 1 is a diagram of a delay line calibration mechanism according to an embodiment of the present invention.

Please refer to FIG. 1, which is a diagram of a delay line calibration mechanism 10 according to an embodiment of the present invention. The delay line calibration mechanism 10 comprises a controller 100, a delay line 110, a switch 120, and a phase detector (PD) 130. The controller 100 may generate an input pulse, a calibration pulse, and a reference pulse. The delay line 110 receives the input pulse or the calibration pulse and outputs a delayed pulse or delayed calibration pulse, respectively. The phase detector 130 has a first input PDIN1 and a second input PDIN2, and receives the reference pulse at the first input PDIN1. To control delay of the delay line 110, the controller 100 also outputs a first delay selection signal for selecting the delay of the delay line 110 during delay of the input pulse, and a second delay selection signal for selecting the delay of the delay line 110 during delay of the calibration pulse. Thus, the delay line 110 may delay the input pulse for a delay period according to the first delay selection signal to output a delayed pulse, and may delay the calibration pulse for a calibration delay period according to the second delay selection signal for outputting a delayed calibration pulse. The switch 120 may be utilized for outputting the delayed pulse as a clock output CLOCK OUTPUT, or for sending the delayed calibration pulse to the phase detector 130 at the second input PDIN2. The phase detector 130 generates a phase difference signal PD_OUT by comparing the delayed calibration pulse and the reference pulse. Then, the controller 100 may control delay of the delay line 110 according to the phase difference signal PD_OUT. The reference pulse may also be sent through a dummy delay line (not shown) set to have zero delay before reaching the phase detector 130 to eliminate intrinsic delay of the delay line 110. The switch 120 may be controlled by a switch control signal SW_CTL. The first delay selection signal and the second delay selection signal may be different values of a delay selection signal DEL_SEL during different operating periods, such as normal operation and calibration. Likewise, the input pulse and the calibration pulse may be alternate pulses of a single pulse signal IN.

Figure 2:
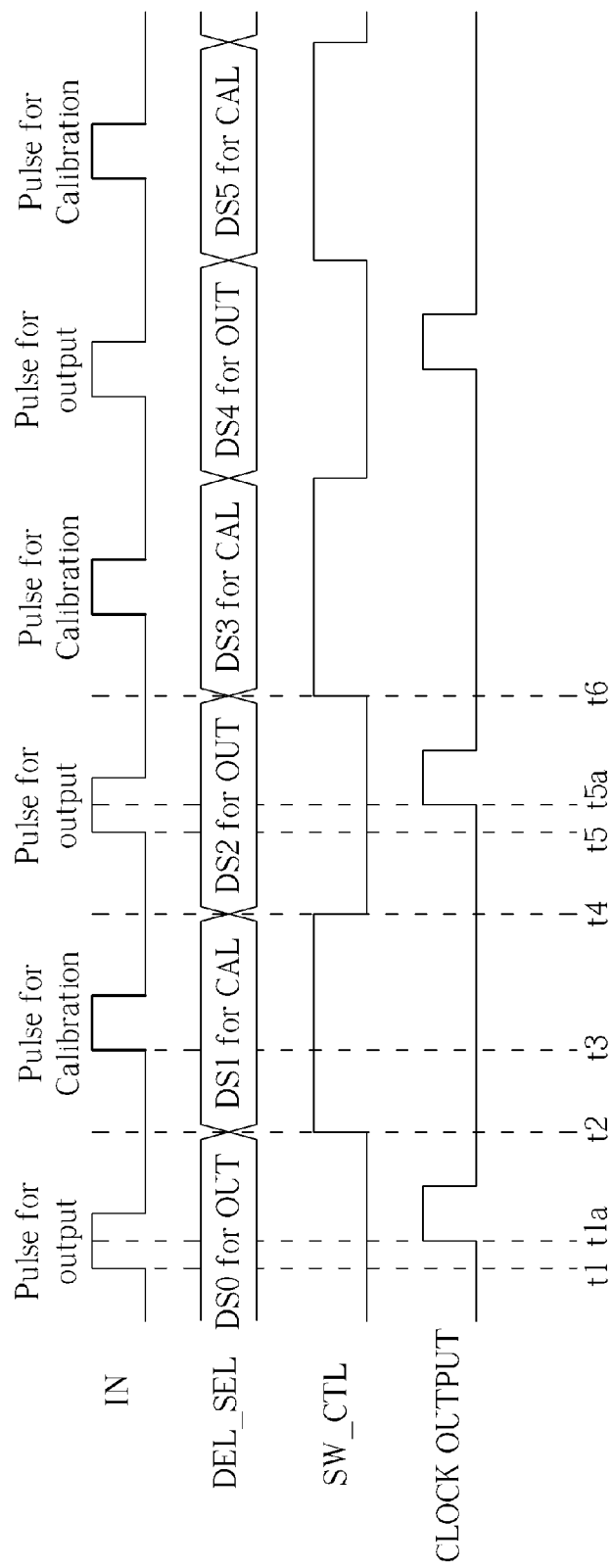
FIG. 2 is a waveform diagram illustrating operation of the delay line calibration mechanism of FIG. 1.

Please refer to FIG. 2, which is a waveform diagram illustrating operation of the delay line calibration mechanism of FIG. 1. At a time t1, the delay selection signal DEL_SEL is in normal operation period, and an input pulse is generated by the pulse signal IN. The input pulse is delayed by the delay line 110 for a delay period DS0. The switch control signal SW_CTL is not active, controlling the switch 120 to couple the output terminal of the delay line 110 to the output terminal of the delay line calibration mechanism 10, so at a time t1a following the time t1 by the delay period DS0, a delayed pulse is outputted as the clock output CLOCK OUTPUT. At a time t2, the delay selection signal DEL_SEL enters calibration operation period, the switch control signal SW_CTL is activated to control the switch 120 to couple the output terminal of the delay line 110 to the phase detector 130, and the delay line 110 is set to a calibration delay period DS1. A calibration pulse is generated by the pulse signal IN, and sent to the delay line 110 at a time t3, where it is delayed for the calibration delay period DS1 and sent through the switch 120 to the phase detector 130. Thus, the clock output does not exhibit a pulse during the calibration operation. The phase detector 130 compares phases of the delayed calibration pulse and the reference pulse to generate a detected phase difference. Then, according to the detected phase difference and difference between the calibration pulse and the reference pulse, a relationship between the calibration delay period DS1 and the length of the delay cell in the delay line 110 can be determined. For example, when the detected phase difference equals zero, the delay amount provided by the delay line 100 equals to the phase difference between the calibration pulse and the reference pulse. The controller 100 then determines the actual length of the delay cell in the delay line 100 and calibrates the delay line 110 accordingly. At a time t4, the delay selection signal DEL_SEL enters normal operation period again, and the switch control signal SW_CTL is deactivated. Another input pulse is delayed by the calibrated delay line 110 from a time t5 to a time t5a, at which time the delayed input pulse is again output as the clock output CLOCK OUTPUT. Because the delay line 110 is calibrated during the calibration period from time t2 to time t4, the clock output at time t5a is much less affected by variations under changing environmental conditions, such as temperature, supply voltage, process, and age.

Although in this embodiment as shown in FIG. 2, the controller 100 generates the input pulse and the calibration pulse alternatively, this is not a limitation of the present invention. In other embodiments, the input pulses and the calibration pulses may have different periods; the normal operation period may be longer than the calibration period, and the controller 100 may generate a calibration pulse each time after a plurality of input pulses are generated. Moreover, as long as the input pulses and the calibration pulses are non-overlapped, the delay line calibration mechanism 10 can achieve on-line calibration while reducing complexity, circuit area, and power consumption.

Figure 3:
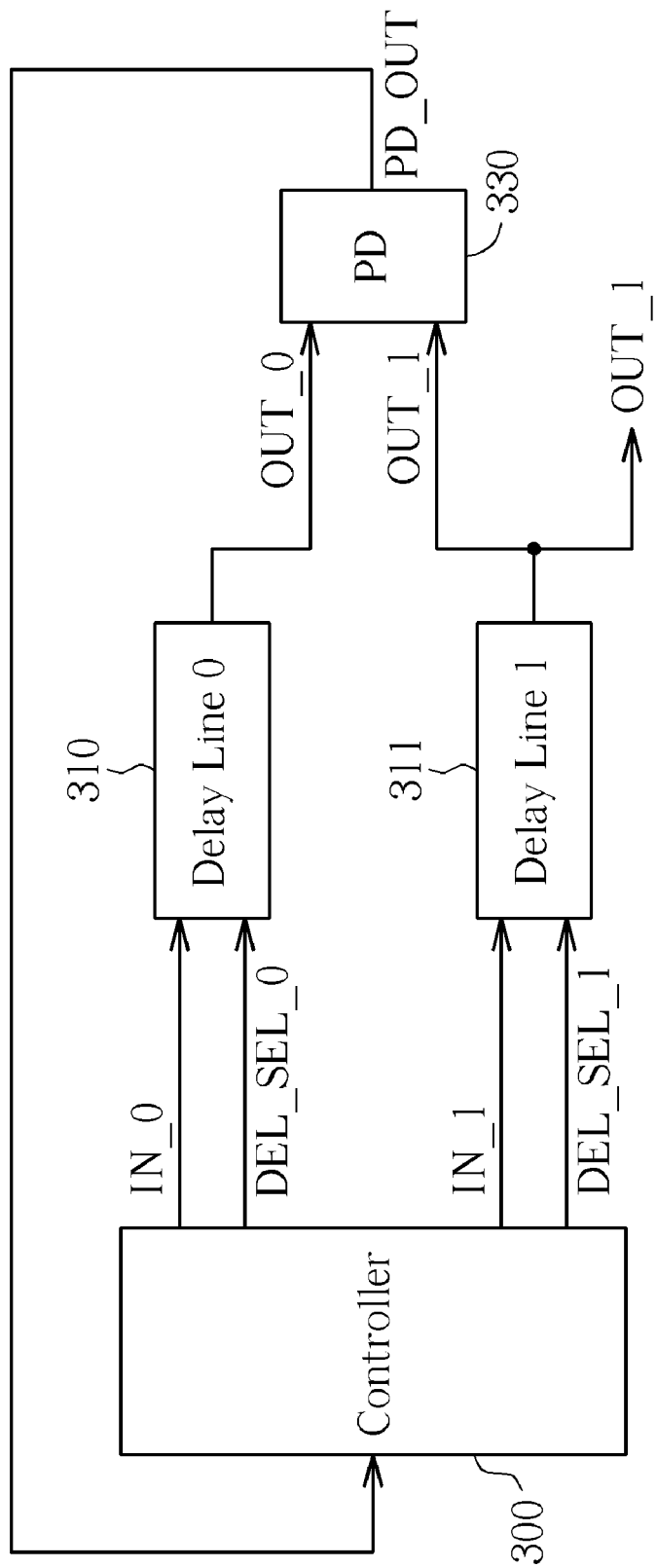
FIG. 3 is a diagram of a delay line calibration mechanism according to a second embodiment.

In the delay line calibration mechanism 10, the delay line 110 comprises a first input node for receiving the input pulse and the calibration pulse (IN), a second input node for receiving the first delay selection signal and the second delay selection signal (DEL_SEL), and an output node for outputting the delayed pulse and the delayed calibration pulse. However, in other embodiments, the delay line 110 may comprise a first input node for receiving the input pulse, a second input node for receiving the first delay selection signal, a third input node for receiving the calibration pulse, a fourth input node for receiving the second delay selection signal, a first output node for outputting the delayed pulse, and a second output node for outputting the delayed calibration pulse. The first to fourth input nodes are coupled to the controller 100, the first output node is coupled to the clock output terminal and the phase detector 130, and the second output node is coupled to the phase detector 130. The switch 120 is omitted in this embodiment. Moreover, the controller 100 may not need to generate the reference pulse; the delayed pulse may be utilized as the reference pulse. FIG. 3 shows an embodiment of this structure.

Please refer to FIG. 3, which is a diagram of a delay line calibration mechanism according to a second embodiment. The delay line calibration mechanism comprises a first delay line 310, a second delay line 311, a controller 300, and a phase detector 330. The first delay line 310 receives a first pulse IN_0 (e.g. the calibration pulse mentioned above) and a first delay selection signal DEL_SEL_0 from the controller 300, and delays the first pulse IN_0 for a first delay period according to the first delay selection signal DEL_SEL_0 to output a first delayed pulse OUT_0. The second delay line 311 receives a second pulse IN_1 (e.g. the input pulse mentioned above) and a second delay selection signal DEL_SEL_1, and delays the second pulse IN_1 for a second delay period according to the second delay selection signal DEL_SEL_1 to output a second delayed pulse OUT_1, which also serves as an output clock. The phase detector 330 generates a phase difference signal PD_OUT indicating the phase difference between the first delayed pulse OUT_0 and the second delayed pulse OUT_1 by comparing the first delayed pulse OUT_0 and the second delayed pulse OUT_1. The controller 300 generates the second delay selection signal DEL_SEL_1, and also generates the first delay selection signal DEL_SEL_0 according to the phase difference signal PD_OUT.

Figure 4:
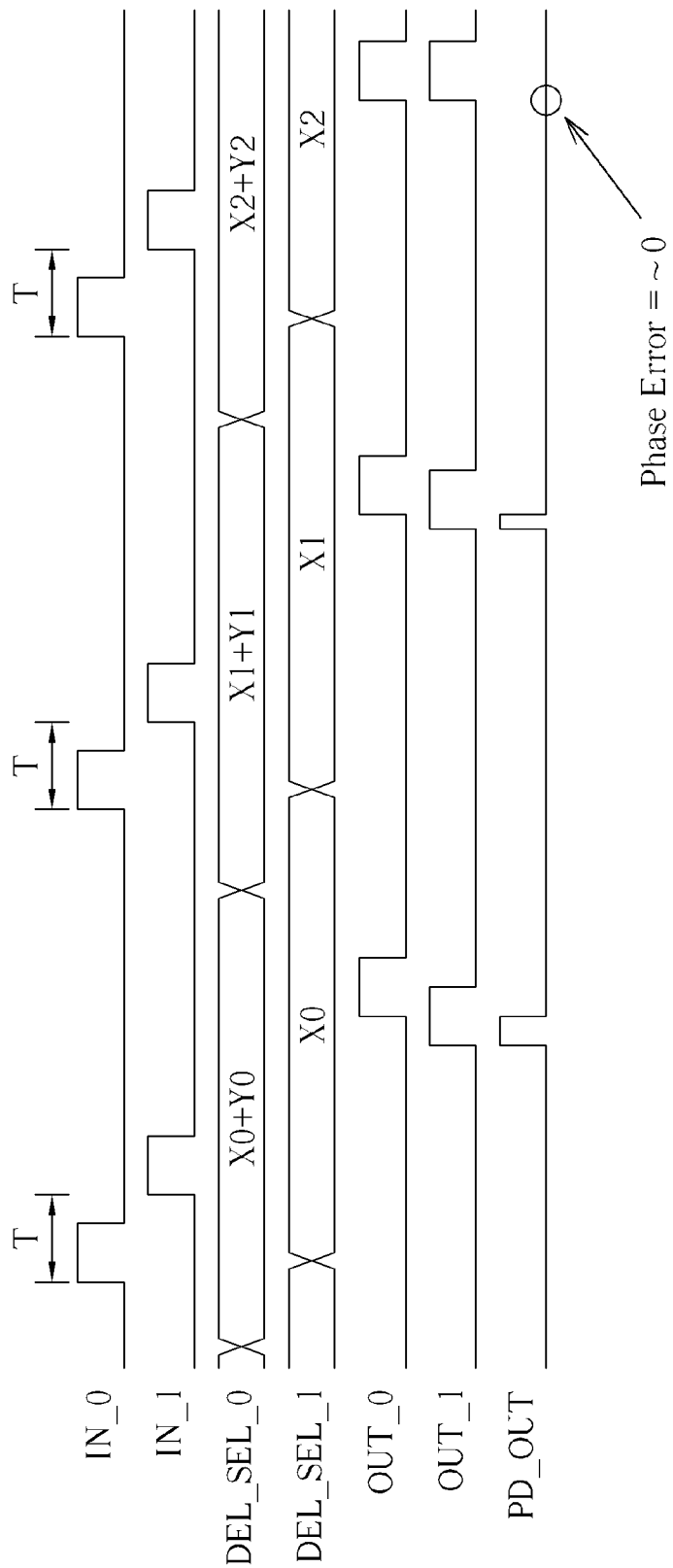
FIG. 4 is a waveform diagram illustrating calibration for FIG. 3.

Please refer to FIG. 4, which is a waveform diagram illustrating calibration for FIG. 3. As can be seen in FIG. 4, each first input pulse IN_0 leads each corresponding second input pulse IN_1 by a predetermined period T (please note that the period T is not necessarily the period of the input pulse IN_0 or period of the input pulse IN_1). To determine how long the first delay line 310 and/or the second delay line 311 is, the first delay selection signal DEL_SEL_0 is utilized to select a first delay period X0+Y0 when the second delay selection signal DEL_SEL_1 is utilized to select a second delay period X0. Based on phase difference of the first delayed pulse OUT_0 and the second delayed pulse OUT_1, the phase detector 330 outputs the phase detection signal PD_OUT. The controller 300 then chooses a second delay period X1 during a subsequent calibration cycle and choose a first delay period X1+Y1 according to the phase detection signal PD_OUT and the second delay period X1. The delay period Y1 is selected towards decreasing the phase difference. As can be seen from FIG. 4, the phase difference of the first delayed pulse OUT_0 and the second delayed pulse OUT_1 is now less than the previous phase delay. The controller 300 continues to adjust the first delay period and/or the second delay period according to the phase detection signal PD_OUT. Once phase difference between the first delayed pulse OUT_0 and the second delayed pulse OUT_1 is approximately zero, the controller 300 determines the relationship between the period T and the delay of the delay line. Knowing the delay period, a conversion factor can easily be determined for how many delay cells of the first delay line 310 equal the delay period T. Thus, the controller 300 may utilize the conversion factor to generate a precise delay of any required delay period.

Figure 5:
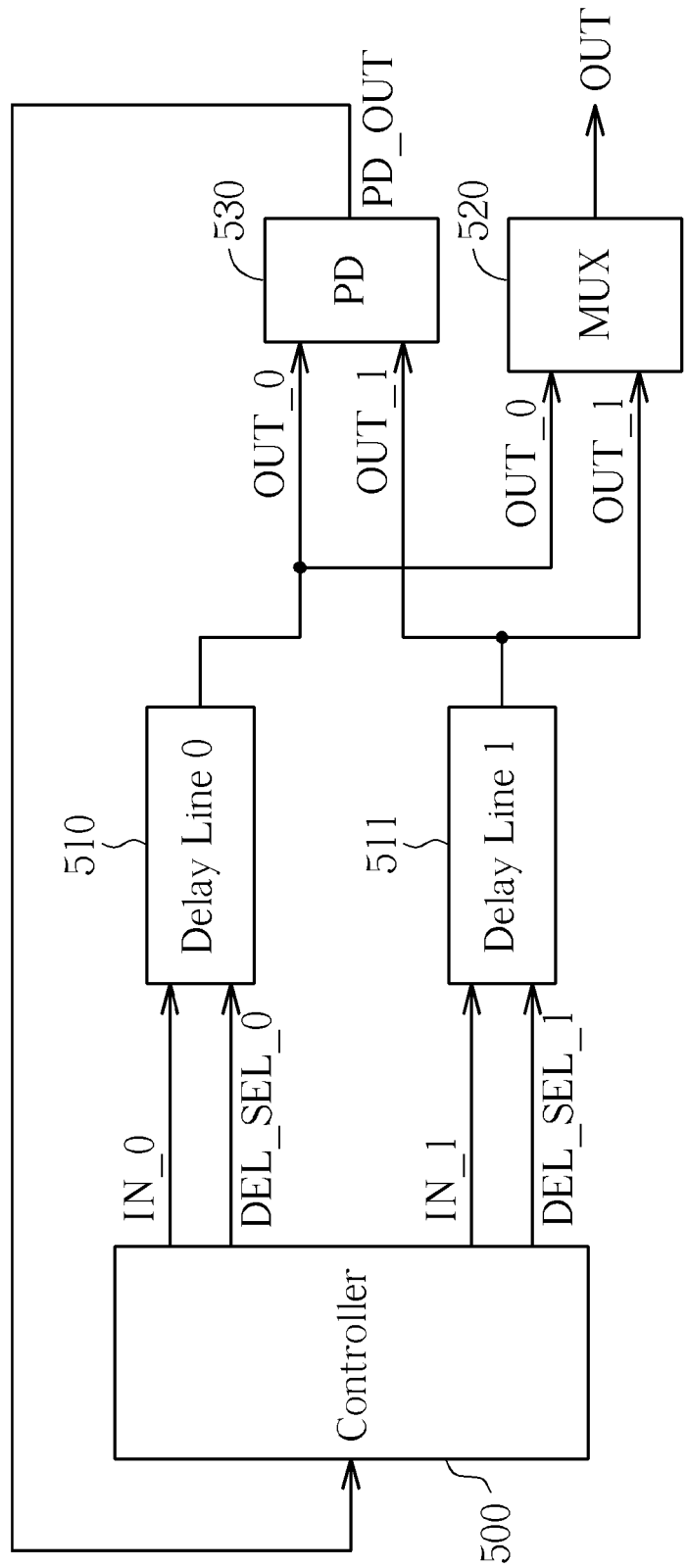
FIG. 5 is a diagram of a delay line calibration mechanism according to a third embodiment.

Please refer to FIG. 5, which is a diagram of a delay line calibration mechanism according to a third embodiment. The delay line calibration mechanism comprises a first delay line 510, a second delay line 511, a controller 500, and a phase detector 530. The first delay line 510 receives a first pulse IN_0 and a first delay selection signal DEL_SEL_0 from the controller 500, and delays the first pulse IN_0 for a first delay period according to the first delay selection signal DEL_SEL_0 to output a first delayed pulse OUT_0. The second delay line 511 receives a second pulse IN_1 and a second delay selection signal DEL_SEL_1, and delays the second pulse IN_1 for a second delay period according to the second delay selection signal DEL_SEL_1 to output a second delayed pulse OUT_1. The phase detector 530 generates a phase difference signal PD_OUT by comparing the first delayed pulse OUT_0 and the second delayed pulse OUT_1. The controller 500 generates the second delay selection signal DEL_SEL_1, and also generates the first delay selection signal DEL_SEL_0 according to the phase difference signal PD_OUT. The delay line calibration mechanism according to the third embodiment further comprises a multiplexer 520 for selectively outputting the first delayed pulse or the second delayed pulse as the output pulse at the output node OUT.

The above delay line calibration mechanisms can be regarded as digital-to-time converters, and are capable of being implemented in phase locked loops and clock generators.

Figure 6:
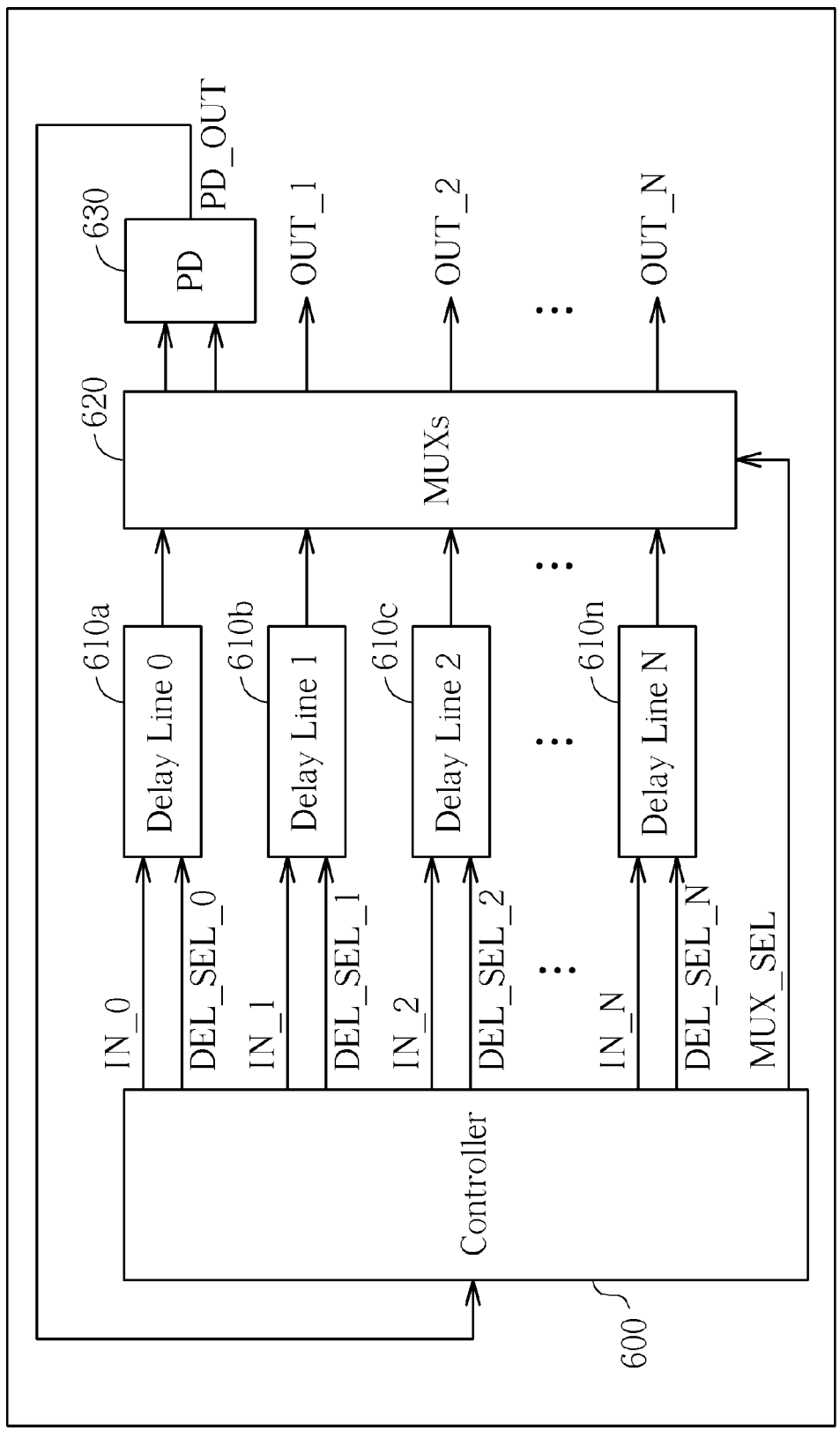
FIG. 6 is a diagram of a multi-clock signal generator according to a fourth embodiment.

Please refer to FIG. 6, which is a diagram of a multi-clock signal generator according to a fourth embodiment. The multi-clock signal generator comprises a first delay line "Delay Line 0" for receiving a first pulse IN_0 and a first delay selection signal DEL_SEL_0, and for outputting a first delayed pulse OUT_0. The multi-clock signal generator further comprises a plurality of delay lines "Delay Line 1", "Delay Line 2", . . . "Delay Line N". Each receives a respective pulse IN_1, IN_2, . . . , IN_N and a respective delay selection signal DEL_SEL_1, . . . , DEL_SEL_N, and each outputs a respective delayed pulse OUT_1, OUT_2, . . . , OUT_N according to the delay selection signal DEL_SEL_1, . . . , DEL_SEL_N. A phase detector 630 generates a phase difference signal PD_OUT by comparing two of the delayed pulses OUT_0, OUT_1, OUT_2, . . . , OUT_N outputted by the respective delay line "Delay Line 0", "Delay Line 1", "Delay Line 2", . . . "Delay Line N". In the embodiment shown in FIG. 6, the phase detector 630 generates the phase difference signal PD_OUT by comparing the first delayed pulse OUT_0 and one of the delayed pulses OUT_1, OUT_2, . . . , OUT_N. A plurality of multiplexers 620 are for selectively sending one of the delayed pulses OUT_1, OUT_2, . . . , OUT_N to the phase detector 630 according to a control signal MUX_SEL, and outputting the delayed pulses OUT_1, OUT_2, . . . , OUT_N as a multi-clock signal. A controller 600 generates the first delay selection signal DEL_SEL_0, and generates the delay selection signals DEL_SEL_1, . . . , DEL_SEL_N according to the phase difference signal PD_OUT. The pulse IN_1 lags the pulse IN_0 by T0, the pulse IN_2 lags the pulse IN_1 by T1, . . . , and the pulse IN_0 lags the pulse IN_N by TN. Since the delay line calibration process is similar to that disclosed in FIG. 3 and FIG. 4, further description is omitted here for brevity.

As can be seen from the above, the delay line calibration mechanism and related multi-clock signal generator are capable of online operation, without requiring offline calibration, and further save area and power consumption, while providing greater delay precision.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay line calibration mechanism comprising:
    a first delay line for receiving a first pulse and a first delay selection signal, and for delaying the first pulse for a first delay period according to the first delay selection signal to output a first delayed pulse;
    a second delay line for receiving a second pulse and a second delay selection signal, and for delaying the second pulse for a second delay period according to the second delay selection signal to output a second delayed pulse;
    a phase detector for generating a phase difference signal indicating the phase difference between the first delayed pulse and the second delayed pulse by comparing the first delayed pulse and the second delayed pulse; and
    a controller for generating the first pulse, generating the second pulse independently of the first pulse, receiving the phase difference signal, generating the second delay selection signal, and using the phase difference signal to generate the first delay selection signal.

2. The delay line calibration mechanism of claim 1, further comprising:
    a multiplexer for selectively outputting the first delayed pulse or the second delayed pulse to serve as an output pulse.

3. The delay line calibration mechanism of claim 1, wherein the controller adjusts the first delay selection signal to decrease the phase difference.

4. The delay line calibration mechanism of claim 3, wherein the controller determines an actual delay amount provided by the first delay line according to a difference between the first delay selection signal and the second delay selection signal when the phase difference between the first delayed pulse and the second delayed pulse is approximately zero.

5. The delay line calibration mechanism of claim 1, wherein the conversion factor represents delay time per delay cell of the first delay line.

6. The multi-phase clock signal generator of claim 5, further comprising a plurality of multiplexers for selectively sending at least two of the delayed pulses to the phase detector and outputting two or more of the delayed pulses as a multi-clock signal.

7. A multi-clock signal generator comprising:
    a plurality of delay lines, each receiving a respective pulse and a respective delay selection signal, and each outputting a respective delayed pulse according to the delay selection signal;
    a phase detector for generating a phase difference signal indicating the difference between at least two of the delayed pulses outputted by the delay lines; and
    a controller for generating the plurality of respective pulses independently of each other, receiving the phase difference signal, using the phase difference signal to generate the delay selection signals, and calculating a non-zero conversion factor based on one of the delay selection signals when the phase difference signal is approximately zero.

8. A method of calibrating a delay line, the method comprising:
generating a first pulse by a controller;
generating a second pulse independently of the first pulse by the controller;
delaying the first pulse for a first delay period according to a first delay selection signal to output a first delayed pulse by a first delay line;
delaying the second pulse for a second delay period according to a second delay selection signal to output a second delayed pulse by a second delay line;
detecting a phase difference between the first delayed pulse and the second delayed pulse to generate a phase difference signal by a phase detector;
calculating a non-zero conversion factor based on the first delay selection signal when the phase difference signal is approximately zero; and
calibrating the first delay line according to the conversion factor.

9. The method of claim 8, wherein the calibration factor represents delay time per delay cell of the first delay line.

10. The method of claim 8, further comprising:
selectively outputting the first delayed pulse or the second delayed pulse to serve as an output pulse by a multiplexer.

11. The delay line calibration mechanism of claim 10, wherein the controller calculates a non-zero conversion factor based on one of the first delay selection signal and the second delay selection signal when the phase difference signal is approximately zero.

12. The method of claim 8, wherein the controller generates the second pulse independently of the first pulse.

13. The method of claim 8, further comprising adjusting the first delay selection signal to decrease the phase difference by the controller.

14. The method of claim 13, further comprising:
the controller determining an actual delay amount provided by the first delay line according to a difference between the first delay selection signal and the second delay selection signal when the phase difference between the first delayed pulse and the second delayed pulse is approximately zero.

15. The method of claim 8, wherein a duty cycle of at least one of the second pulse and the first pulse is not 50%.

16. A delay line calibration mechanism comprising:
a first delay line for receiving a first pulse and a first delay selection signal, and for delaying the first pulse for a first delay period according to the first delay selection signal to output a first delayed pulse;
a second delay line for receiving a second pulse and a second delay selection signal, and for delaying the second pulse for a second delay period according to the second delay selection signal to output a second delayed pulse;
a phase detector for generating a phase difference signal indicating the phase difference between the first delayed pulse and the second delayed pulse by comparing the first delayed pulse and the second delayed pulse; and
a controller for generating the first pulse, generating the second pulse independently of the first pulse, receiving the phase difference signal, generating the second delay selection signal, and using the phase difference signal to generate the first delay selection signal, wherein a duty cycle of at least one of the second pulse and the first pulse is not 50%.

17. The delay line calibration mechanism of claim 16, further comprising:
a multiplexer for selectively outputting the first delayed pulse or the second delayed pulse to serve as an output pulse.

18. The delay line calibration mechanism of claim 16, wherein the controller generates the second pulse independently of the first pulse.

19. The delay line calibration mechanism of claim 16, wherein the controller adjusts the first delay selection signal to decrease the phase difference.

20. The delay line calibration mechanism of claim 19, wherein the controller determines an actual delay amount provided by the first delay line according to a difference between the first delay selection signal and the second delay selection signal when the phase difference between the first delayed pulse and the second delayed pulse is approximately zero.

* * * * *